United States Patent [19]

Settles et al.

[11] Patent Number: 5,721,451
[45] Date of Patent: Feb. 24, 1998

[54] INTEGRATED CIRCUIT ASSEMBLY ADHESIVE AND METHOD THEREOF

[75] Inventors: John R. Settles, Mesa; Richard D. Mountjoy, Gilbert, both of Ariz.

[73] Assignee: Motorola, Inc., Schaumburg, Ill.

[21] Appl. No.: 758,660

[22] Filed: Dec. 2, 1996

[51] Int. Cl.⁶ .................................................. H01L 23/02
[52] U.S. Cl. .......................... 257/679; 257/777; 257/778; 257/782; 257/783
[58] Field of Search .............................. 257/679, 777, 257/778, 782, 783

[56] References Cited

U.S. PATENT DOCUMENTS 4,774,633  9/1988  Dehaine et al. .................. 257/679
5,523,628  6/1996  Williams et al. ................. 257/777

*Primary Examiner*—Wael Fahmy
*Assistant Examiner*—David B. Hardy
*Attorney, Agent, or Firm*—Robert D. Atkins

[57] ABSTRACT

An integrated circuit assembly (16) embodied as flip-chip is encased in a plastic card (12) to form a smart card assembly (10). The flip-chip assembly has a substrate (20) with plated pads, and a semiconductor die (30) with contacts (32) to be connected to the plated pads on the substrate. An adhesive (38) is applied at selected locations less than an entire surface area between the substrate and the die for maintaining a fixed positional relationship between the substrate and the die. The selected locations, typically dots or a bead inside or around the perimeter of the die, have detrimental stress induced by differences in coefficients of thermal expansion between the die and the substrate before the contacts of the die are connected to the plated pads of the substrate during a reflow or cure process.

13 Claims, 1 Drawing Sheet

INTEGRATED CIRCUIT ASSEMBLY ADHESIVE AND METHOD THEREOF

BACKGROUND OF THE INVENTION

The present invention relates in general to integrated circuits and, more particularly, to an adhesive applied between a die and a substrate to maintain a fixed positional relationship therebetween.

An integrated circuit assembly typically comprises a substrate that forms a physical and structural foundation for an integrated circuit die. The integrated circuit die is electrically connected to bonding pads on the substrate that allow communication between the die and external devices as is well known.

One integrated circuit application is the smart card where an integrated circuit module is disposed in a plastic card, similar to a credit card. The integrated circuit module includes a microcontroller and memory device such as EEPROM of sufficient size to store large amounts of personal information. For example, the module is capable of storing a person's complete medical history from birth. When a person receives medical care, the medical staff need only read the card to obtain a medical history of the patient including name, address, birth date, primary care physician, medical insurance provider, religious preference, current medications, allergies, known conditions such as diabetes, prior operations, and so on.

In other applications, the smart card module can store financial information, security information, frequent flyer mileage, and many other forms of personal and business data. The smart card can also operate as a debit card or a telephone card with a stored monetary value that is updated with each transaction.

An important consideration for the smart card is its overall thickness. The assembly should be keep as close as possible to the thickness of an ordinary credit card for easy of carrying and use by consumers. If the smart card becomes too thick and cumbersome, it will be less accepted by consumers. In addition, thicker plastic cards are more expensive to manufacture.

In the prior art, the smart card includes a plastic card with a pocket or cavity milled out of the card for the integrated circuit module. The module includes a die disposed over a substrate and electrically connected with gold or aluminum wire bonds. The wire bonds typically rise vertically from the die and bend over to a bonding pad on the substrate. The height of the wire bonds increase the thickness of the module. The cavity in the plastic smart card needs to be cut deep to avoid a noticeable bulge in the card. The deep module cavity results in either an overall thicker card which is undesirable as described above, or the backwall between the bottom on the cavity and the opposite side of the smart card becomes unacceptable thin. A thin backwall easily cracks under the normal stress of use and bending. A thin backwall also tends to ripple which is aesthetically undesirable in showing the module pocket or cavity.

Hence, a need exists for smart card that is acceptable thin in the minds of consumers while maintaining sufficient thickness in the backwall to avoid cracking.

DETAILED DESCRIPTION OF THE PREFERRED EMBODIMENT

Figure 1:
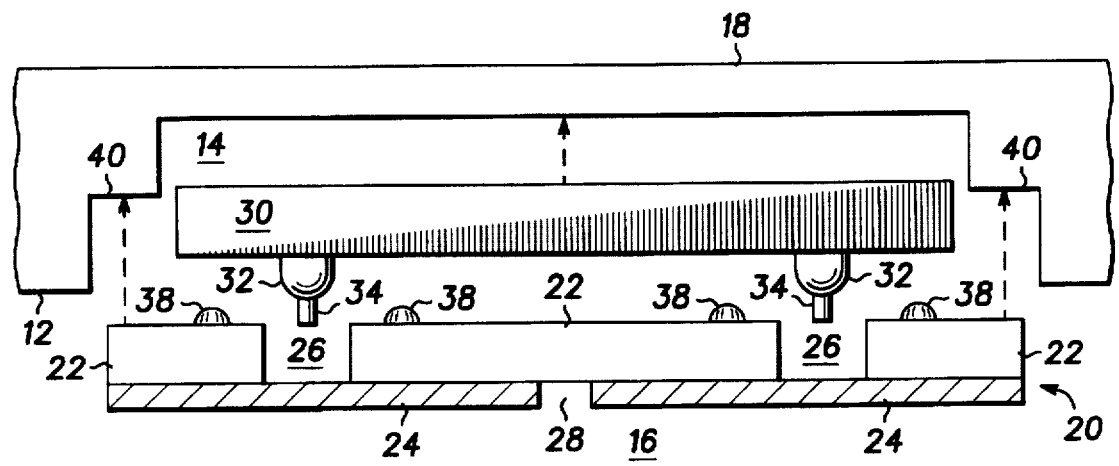
FIG. 1 is a side-view illustrating a smart card assembly with a flip-chip module.

Referring to FIG. 1, a side-view of smart card assembly 10 is shown including a plastic card 12 having a pocket or cavity 14 milled out of one surface of the card to house integrated circuit module assembly 16. Module 16 is a flip-chip assembly that uses ball contacts to join the substrate and die together. The overall height of flip-chip assembly 16 is about 450.0 microns which is less than a conventional wire bond type of assembly because the flip-chip does not use conventional wire bonds.

A backwall 18 is formed between the back surface of cavity 14 and the opposite surface of plastic card 12. The flip-chip assembly 16 allows backwall 18 to be about 250.0 microns thick to avoid cracking or rippling while still using a standard thickness (e.g. 800.0 microns) for plastic card 12. Flip-chip assembly 16 should not come in contact with backwall 18 when smart card 10 is fully assembled. The remaining 100.0 microns is taken up as buffer space between the top of flip-chip assembly 16 and the inner surface of backwall 18.

Flip-chip assembly 16 also allows a thinner backwall of say 125.0 microns which in turn allows the overall card thickness to be reduced to 650.0 microns with 75.0 mircons of buffer space. The thinner card is a more desirable end-product for consumers.

Module assembly 16 includes a multilayer substrate 20 having a dielectric layer 22 overlaying a metallization layer 24 which are joined together by an adhesive layer (not shown). Substrate 20 operates as a physical, structural, and electrical foundation for semiconductor die 30. Dielectric layer 22 is made from polyimide, epoxy glass, or other suitable dielectric material. Metallization layer 24 is made of copper with nickel-gold plating and provides electrical conductors between die 30 and devices external to plastic card 12. Gap 28 provides electrical isolation between the individual conductors in metallization layer 24.

Wells 26 are formed in dielectric layer 22 by punching or laser cut. Substrate 20 and semiconductor die 30 come together to form flip-chip assembly 16. Die 30 includes ball or bump electrical contacts 32 and extended tips or tails 34. Semiconductor die 30 typically has 5–10 contacts 32 with associated conductors and gaps in metallization layer 24 for inputting and outputting electrical signals. A solder paste or conductive epoxy is placed in wells 26 to form an electrical contact between ball or bump contacts 32 and conductors in metallization layer 24 during a reflow or cure process. At the bottom of wells 26 is a plated pad and conductor in metallization layer 24 to route the electrical signals from semiconductor die 30 to external devices. For example, when smart card assembly 10 is swiped through a card reader (not shown), the wipers in the card reader make electrical contact with the conductors in metallization layer 24 which in turn contact semiconductor die 30.

The ball contacts 32 and extended tips 34 of flip-chip semiconductor die 30 are lowered into wells 26 during the reflow or cure process. If a solder paste is placed in wells 26, then flip-chip module assembly 16 is reflowed at say 250° C. to join contacts 32 and extended tips 34 through the solder to the conductors in metallization layer 24 at the bottom of wells 26. If a conductive epoxy is placed in wells 26, then the flip-chip module assembly 16 is cured at say 175° C. to solidify and join contacts 32 and extended tips 34 through the conductive epoxy to the conductors in metallization layer 24 at the bottom of wells 26.

During the temperature heating and cooling that occurs with the reflow and cure processes, differences in the thermal coefficient of expansion cause substrate 20 to move up to ten times more than die 30. The movement occurs in all three directions: x, y, and z. The difference in movement between substrate 20 and die 30 creates stresses on the contact point between ball contacts 32 and the conductive material in wells 26. The electrical connection between ball contacts 32 and the conductive material in wells 26 can easily break, fracture, or otherwise separate in the presence of the thermal induced stresses causing a short or a void (electrical open).

Figure 2:
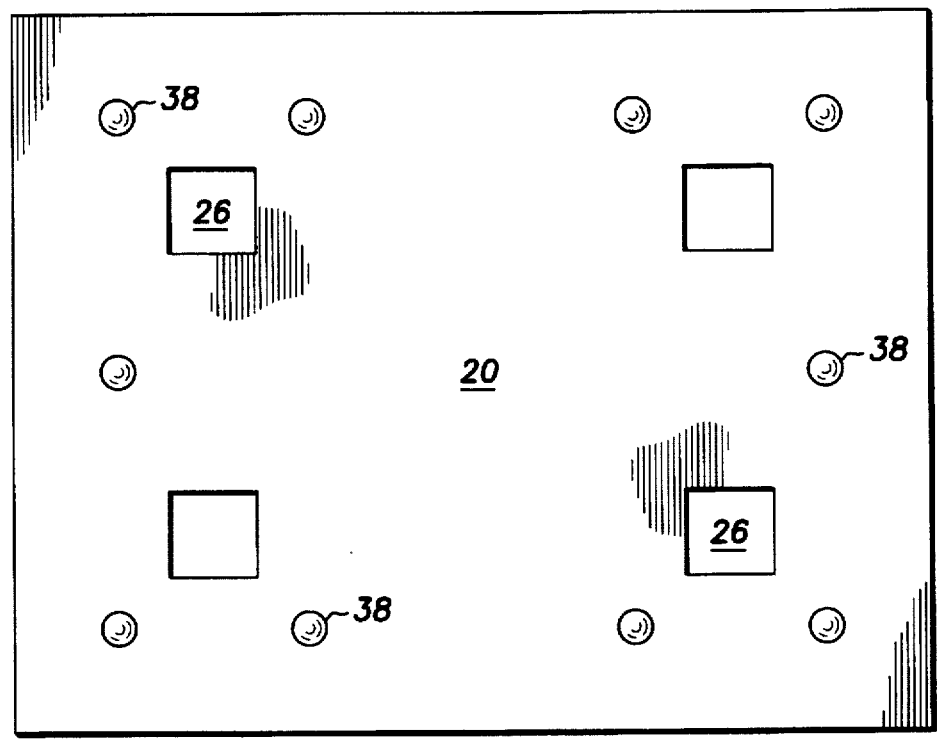
FIG. 2 is a top-view of the substrate with adhesive dots applied at selected locations.

As part of the present invention, an adhesive epoxy 38 is added to the surface(s) of substrate 20 and/or die 30 before the reflow or cure step. The adhesive epoxy 38 can be applied as dots to dielectric layer 22 shown as a top-view in FIG. 2. Alternatively, adhesive dots 38 are to applied to die 30. The dots are typically 500–1000 microns in diameter and spaced about 1000–3000 microns apart or more depending on the die. The dots are applied with syringe, screen stencil, or pin transfer. Adhesive dots 38 need not cover the entire surface area of substrate 20 and/or die 30 because that is typically more coverage than is necessary to achieve the objective of holding the die and substrate together during temperature heating and cooling at reflow or cure. Instead, adhesive dots 38 are applied at selected locations of detrimental stress due to the differences of coefficient of thermal expansion between substrate 20 and die 30. The selected locations are typically along the inside perimeter of die 30 where significant movement occurs, or at corresponding positions on dielectric layer 22.

Adhesive dots 38 have good "green state" strength, i.e. gripping strength immediately upon contact even before complete cure. Adhesive dots 38 typically cure before the conductive epoxy cures or the solder reflows for maximum gripping strength. Once adhesive dots 38 are applied to dielectric layer 22 and/or die 30, the two assemblies are pressed together to secure the bond and then extended tips 34 are placed in wells 26 for reflow or cure. The adhesive dots 38 operate to stabilize movement of substrate 20 and die 30 to negate any mismatch of coefficients of thermal expansion. Therefore, any stress developed during temperature changes by differences in coefficient of thermal expansion between substrate 20 and die 30, i.e. all three dimensions, are taken up by adhesive dots 38 instead of contacts 32 and the conductive material in wells 26. The electrical connection between contacts 32 and the conductive material in wells 26 remains intact during and after the reflow and cure processes.

In an alternate embodiment, die 30 can first be placed next to substrate 20 after which adhesive 38 is tacked or applied as a bead around one or more edges of the module. Again, adhesive 38 is a good contact cement to hold die 30 to substrate 20 during the reflow or cure process to stabilize movement of substrate 20 and die 30 and negate any mismatch of coefficients of thermal expansion. Any stress developed during temperature changes by differences in coefficient of thermal expansion between substrate 20 and die 30 are taken up by adhesive dots 38 instead of contacts 32 and the conductive material in wells 26. The electrical connection between contacts 32 and the conductive material in wells 26 remains intact during and after the reflow and cure processes.

After the reflow or cure process when semiconductor die 30 and substrate 20 are securely joined as flip-chip module assembly 16, module 16 is underfilled with epoxy resin to provide an environmental seal. Module 16 is placed in cavity 14 and secured with adhesive at lips 40 to complete smart card assembly 10.

The present invention is applicable to other integrated circuit assemblies where it is desirable to maintain a fixed positional relationship between a die and a substrate during processing.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An integrated circuit assembly, comprising:

a substrate having wells formed in the substrate extending below a surface of the substrate to conductive pads;

a die having contacts extending from a surface of the die, wherein the surface of the die is joined to the surface of the substrate so that the contacts are positioned in the wells at least partially below the surface of the substrate and connected to the conductive pads on the substrate; and an adhesive disposed at selected locations less than an entire surface area between the substrate and the die where the surface of the die is joined to the surface of the substrate by the adhesive to maintain a fixed positional relationship between the substrate and the die.

2. The integrated circuit assembly of claim 1 wherein the adhesive is applied before the contacts of the die are connected to the pads of the substrate.

3. The integrated circuit assembly of claim 2 wherein the contacts of the die are connected to the pads of the substrate by a reflow or cure process.

4. The integrated circuit assembly of claim 1 wherein the adhesive is applied at selected locations of stress induced by differences in coefficients of thermal expansion between the die and the substrate.

5. The integrated circuit assembly of claim 4 wherein the adhesive is applied as dots inside a perimeter of the die.

6. The integrated circuit assembly of claim 4 wherein the adhesive is applied around a perimeter of the die.

7. The integrated circuit assembly of claim 1 further including a plastic card for encasing the die and substrate.

8. A smart card, comprising:

a plastic card; and a flip-chip assembly encased in the plastic card, the flip-chip assembly including, (a) a substrate having wells formed in the substrate extending below a surface of the substrate to conductive pads, (b) a die having contacts extending from a surface of the die, wherein the surface of the die is joined to the surface of the substrate so that the contacts are positioned in the wells at least partially below the surface of the substrate and connected to the conductive pads on the substrate, and (c) an adhesive disposed at selected locations less than an entire surface area between the substrate and the die where the surface of the die is joined to the surface of the substrate by the adhesive to maintain a fixed positional relationship between the substrate and the die.

9. The flip-chip assembly of claim 8 wherein the adhesive is applied before the contacts of the die are connected to the pads of the substrate.

10. The flip-chip assembly of claim 9 wherein the contacts of the die are connected to the pads of the substrate by a reflow or cure process.

11. The flip-chip assembly of claim 8 wherein the adhesive is applied at selected locations of stress induced by differences in coefficients of thermal expansion between the die and the substrate.

12. The flip-chip assembly of claim 11 wherein the adhesive is applied as dots inside a perimeter of the die.

13. The flip-chip assembly of claim 11 wherein the adhesive is applied around a perimeter of the die.

* * * * *